(12) United States Patent
Chang et al.

(10) Patent No.: US 7,812,519 B2
(45) Date of Patent: Oct. 12, 2010

(54) TOP-EMITTING ORGANIC ELECTROLUMINESCENT DISPLAY

(75) Inventors: Shih-Chang Chang, Jhudong Township (TW); Chang-Ho Tseng, Sinwu Township (TW); Shih-Pin Wang, Toufen Township (TW)

(73) Assignee: TPO Displays Corp., Chu-Nan (TW)

( * ) Notice: Subject to any disclaimer, the term of this patent is extended or adjusted under 35 U.S.C. 154(b) by 429 days.

(21) Appl. No.: 12/009,187

(22) Filed: Jan. 16, 2008

(65) Prior Publication Data

US 2008/0169757 A1 Jul. 17, 2008

(30) Foreign Application Priority Data

Jan. 16, 2007 (TW) .............................. 96101602 A

(51) Int. Cl.
*H01J 1/62* (2006.01)
(52) U.S. Cl. ...................... 313/504; 313/506
(58) Field of Classification Search ......... 313/504–506, 313/512
See application file for complete search history.

(56) References Cited

U.S. PATENT DOCUMENTS

| | | | | |
|---|---|---|---|---|
| 5,693,962 A | * | 12/1997 | Shi et al. | ...................... 257/89 |
| 6,091,078 A | * | 7/2000 | Codama | ...................... 257/40 |
| 6,861,800 B2 | | 3/2005 | Tyan et al. | |
| 2006/0066230 A1 | * | 3/2006 | Kubota et al. | ............... 313/506 |

FOREIGN PATENT DOCUMENTS

| CN | 1668148 | 9/2005 |
|---|---|---|
| CN | 1713789 | 12/2005 |

* cited by examiner

*Primary Examiner*—Vip Patel
(74) *Attorney, Agent, or Firm*—Liu & Liu

(57) ABSTRACT

The invention provides a top emitting organic electroluminescent display comprising a substrate including a display area. A conductive layer is disposed on the substrate, electrically connecting the substrate. A reflective layer is disposed on the display region of the substrate. A dielectric layer is formed on the conductive layer, the reflective layer and the substrate, with a via exposing the conductive layer. A transparent electrode layer is disposed on the dielectric layer, electrically connecting the conductive layer through the via. An organic electroluminescent layer corresponding to the display region is disposed on the transparent electrode layer.

18 Claims, 4 Drawing Sheets

TOP-EMITTING ORGANIC ELECTROLUMINESCENT DISPLAY

FIELD OF THE INVENTION

The invention relates to a top-emitting organic electroluminescent display, and more particularly to a top-emitting organic electroluminescent display with enhanced light emitting efficiency and chromaticity.

DESCRIPTION OF THE RELATED ART

The light emitting principle of organic electroluminescent displays, also known as organic light emitting diode (OLED), is to apply an electric field to an organic molecule material to produce luminescence. The organic electroluminescent displays may have a dot matrix type display due to self emission, and have advantages of lighter weight, thinner volume, higher contrast, lower power consumption, higher resolution, faster response time, no backlight requirement and wide viewing angles. The organic electroluminescent displays may have a panel size ranging from 4 mm for a micro-display, to 100 inches for a large-scale outdoor signboard. The organic electroluminescent displays are expected to become the mainstream for the next generation flat panel displays. Besides display applications, the organic electroluminescent elements can also be disposed on light, thin and flexible material to form a dot matrix type structure.

There are three types of coloring structures for the organic electroluminescent displays, which include a trichromatic light emitting layer, a color change media (CCM), and a color filter (CF), wherein the trichromatic light emitting layer is the dominating structure of the full color organic electroluminescent displays. The trichromatic light emitting layer includes light emitting materials of red, green and blue coated in respective pixels, and different bias voltages are applied to the light emitting materials to produce full colors. The trichromatic light emitting layer has an optimum light emitting efficiency.

BRIEF SUMMARY OF THE INVENTION

The invention provides a top-emitting organic electroluminescent display to overcome the impedance problem produced from the reflective layer oxidation of a conventional top-emitting organic electroluminescent display and to enhance light emitting efficiency and chromaticity by adjusting the thickness of the dielectric layer thereof.

The invention provides a top-emitting organic electroluminescent display comprising a substrate including a display area. A conductive layer is disposed on the substrate and electrically connected to the substrate. A reflective layer is disposed on the display area of the substrate. A dielectric layer is disposed over the conductive layer, the reflective layer and the substrate, wherein the dielectric layer has a via exposing the conductive layer. A transparent electrode layer is disposed on the dielectric layer and electrically connected to the conductive layer through the via. An organic electroluminescent layer is disposed on the transparent electrode layer over the display area.

The invention further provides a top-emitting organic electroluminescent display comprising a substrate including a plurality of sub-pixel areas of different colors. A conductive layer is disposed on the sub-pixel areas of the substrate and electrically connected to the substrate. A reflective layer is disposed on the sub-pixel areas of the substrate. A dielectric layer is disposed over the conductive layer, the reflective layer and the substrate, wherein the dielectric layer has a via exposing the conductive layer, and the dielectric layer has different thicknesses at the sub-pixel areas of different colors. A transparent electrode layer is disposed on the dielectric layer and electrically connected to the conductive layer through the via. A plurality of organic electroluminescent layers with different colors are disposed on the transparent electrode layer over the sub-pixel areas.

A detailed description is given in the following embodiments with reference to the accompanying drawings.

BRIEF DESCRIPTION OF THE DRAWINGS

The invention can be more fully understood by reading the subsequent detailed description and examples with reference to the accompanying drawings, wherein.

DETAILED DESCRIPTION OF THE INVENTION

The following description is of the best-contemplated mode of carrying out the invention. The description is provided for illustrating the general principles of the invention and is not meant to be limiting. The scope of the invention is best determined by reference to the appended claims.

Figure 1:
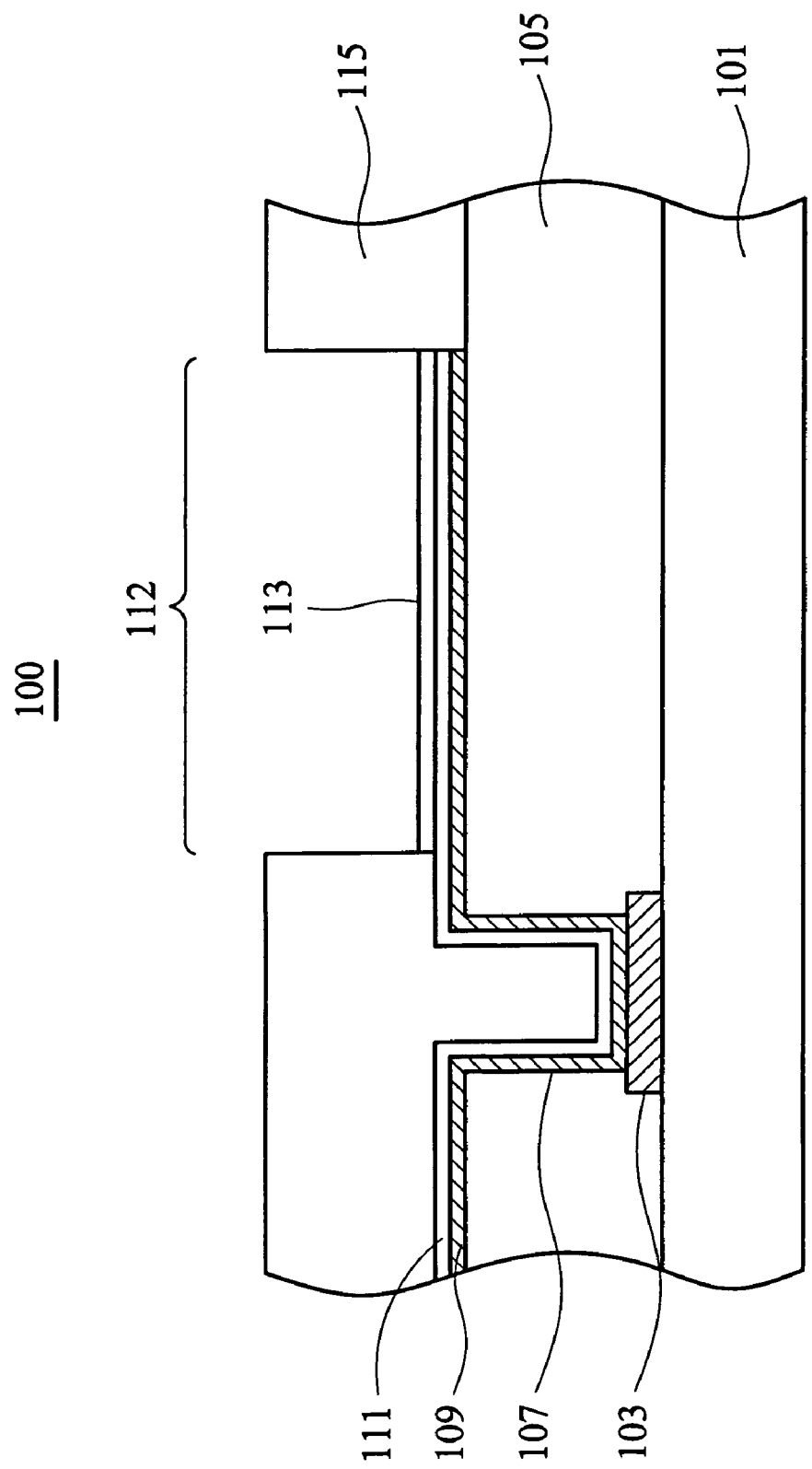
FIG. 1 is a schematic cross section of a top-emitting organic electroluminescent display as known from the inventors.

FIG. 1 is a cross section of a top-emitting organic electroluminescent display as known from the inventors. Note the structure of FIG. 1 is not a prior art, and it is used to illustrate the problems of the processes discovered by the inventors.

Referring to FIG. 1, the top-emitting organic electroluminescent display 100 comprises an active device substrate 101 having a plurality of driving devices thereon (not shown). A conductive layer 103 is disposed on the active device substrate 101, which is a contact for electrically connecting a pixel electrode of the organic electroluminescent display to a source/drain of the active device substrate 101. The material of the conductive layer can be such as Cu or Al. A dielectric layer 105 is formed on the active device substrate 101 and the conductive layer 103, with a via 107 exposing a top surface of a portion of the conductive layer 103. A reflective layer 109 is formed on the dielectric layer 105, the exposed conductive layer 103, and along the via 107. The material of the reflective layer generally can be metal for reflecting luminescence to enhance light emitting efficiency of the top-emitting organic electroluminescent display 100. A transparent electrode layer 111 is formed on the reflective layer 109. The material of the transparent electrode layer 111 generally can be ITO, which is as a pixel electrode of the organic electroluminescent display 100 and electrically connected to the active device substrate 101 through the conductive layer 103. An organic electroluminescent layer 113 is formed on the transparent electrode layer 111, and surrounded by a pixel definition layer 115 to define a display area 112.

In the top-emitting organic electroluminescent display 100 shown in FIG. 1, the metal layer with high reflectivity (i.e. reflective layer 109) is used as a bottom reflective structure of the display to enhance the light emitting efficiency. However, because some metal oxide is commonly produced on the interface between the metal layer and the transparent electrode layer 111, the resistance thereof is increased and the light emitting efficiency of the organic electroluminescent display 100 is reduced. Furthermore, the reflective layer 109 is adjacent to the transparent electrode layer 111, so that the route of the luminescent light of the organic electroluminescent layer 113 cannot be adjusted efficiently to enhance the light emitting efficiency and chromaticity of the display.

For resolving the above problems pertaining to the resistance and the light emitting efficiency, the invention provides a top-emitting organic electroluminescent display, wherein the position of the reflective layer and the thickness of the dielectric layer are adjusted, so that the resistance is reduced and the light emitting efficiency and chromaticity are enhanced efficiently.

Figure 2:
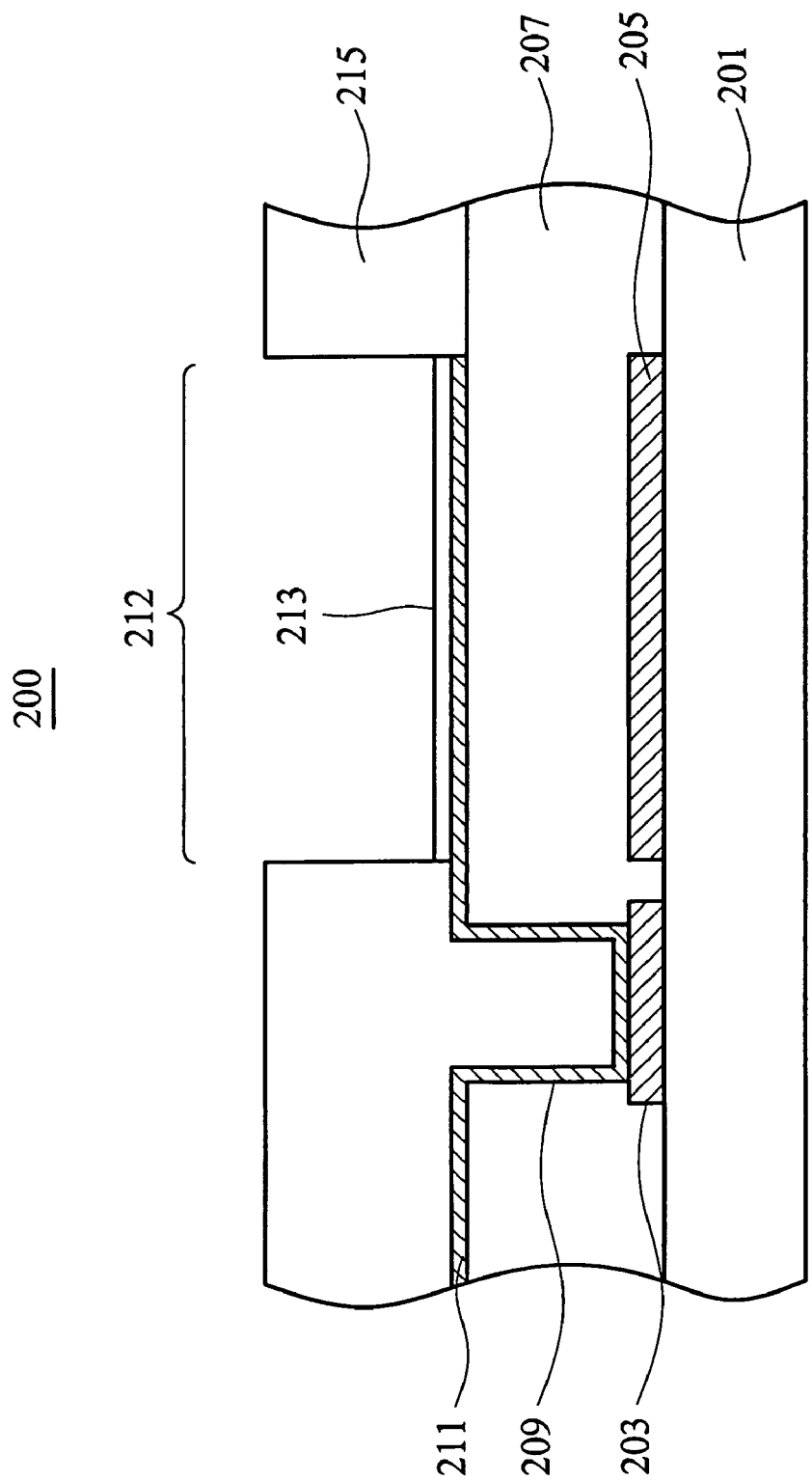
FIG. 2 is a schematic cross section of a top-emitting organic electroluminescent display according to an embodiment of the invention.

FIG. 2 shows a cross section of a top-emitting organic electroluminescent display 200 of an embodiment of the invention. The top-emitting organic electroluminescent display 200 comprises a substrate 201 such as an active device substrate having a plurality of driving devices thereon (not shown). The active device substrate 201 further comprises a conductive layer 203 and a reflective layer 205 thereon. The conductive layer 203 may be formed from Cu or Al, which is used as a contact for electrically connecting a pixel electrode of the organic electroluminescent display to the source/drain of the active device substrate 201. The reflective layer 205 can be formed from Al or Ag, which is disposed at a display area 212 to reflect the luminescence from an organic electroluminescent layer 213 and enhance the light emitting efficiency of the display. The conductive layer 203 and the reflective layer 205 may be formed from the same layer. The reflective layer 205 may be fabricated while the conductive layer 203 is formed, and the conductive layer 203 and the reflective layer 205 can be formed from the same material or different materials. The conductive layer 203 is not connected to the reflective layer 205 as shown in FIG. 2. However, in another embodiment, the conductive layer 203 and the reflective layer 205 may be a continuous structure formed from the same layer.

Next, a dielectric layer 207 is formed on the active device substrate 201, the conductive layer 203 and the reflective layer 205. The material of the dielectric layer 207 may be silicon oxide, silicon nitride or combinations thereof. The dielectric layer 207 has a via 209 exposing a top surface of a portion of the conductive layer 203. A transparent electrode layer 211 is formed on the dielectric layer 207, the exposed conductive layer 203, and along the via 209. The material of the transparent electrode layer 211 is for example, indium tin oxide (ITO), indium zinc oxide (IZO), cadmium tin oxide (CTO), metallized AZO, zinc oxide (ZnO), indium nitride (InN) or stannum dioxide (SnO2). The transparent electrode layer 211 is used as a pixel electrode of the organic electroluminescent display 200, and electrically connects to the source/drain of the active device substrate 201 through the conductive layer 203. The organic electroluminescent layer 213 is formed on the transparent electrode layer 211 over the display area 212, corresponding to the reflective layer 205 under the dielectric layer 207. The material of the organic electroluminescent layer 213 may be small molecules or polymer of fluorescent or phosphorescent materials. Although there is only one layer of the organic electroluminescent layer in FIG. 2, one skilled in the art would appreciate that besides the organic electroluminescent layer, the organic electroluminescent display further comprises a hole injection layer (HIL), a hole transporting layer (HTL), a electron injection layer (EIL), and a electron transporting layer (ETL). For brevity, these layers are not described or shown. The top-emitting organic electroluminescent display 200 further comprises a pixel definition layer 215 surrounding the organic electroluminescent layer 213 to define the display area 212. In addition to the above structures, there are an upper electrode, a passivation layer and a transparent upper substrate (not shown) formed on the organic electroluminescent layer in sequence.

Referring to FIG. 2, after the via 209 is formed through the dielectric layer 207, the transparent electrode layer 211 is formed along the via 209 and on the conductive layer 203 and the dielectric layer 207. However, as shown in FIG. 1, firstly, the reflective layer 109 is formed along the via 107 and on the conductive layer 103 and the dielectric layer 105. Then, the transparent electrode layer 111 is formed on the reflective layer 109. In the embodiment of the invention, there is no metal oxide formed along the via 209, unlike the metal oxide formed on the interface between the metal reflective layer and the transparent electrode layer of the display as shown in FIG. 1, thus the embodiment of the invention can prevent resistance from increasing. Furthermore, compared with the top-emitting organic electroluminescent display 100 as shown in FIG. 1, the reflective layer 205 of the embodiment of the invention is formed at the display area 212 and under the dielectric layer 207, thus the dielectric layer 207 can be as a microcavity layer to make the light produce a microcavity effect in the dielectric layer 207. Because the dielectric layer 207 is disposed between the transparent layer 211 and the reflective layer 205 at the display area 212, the down route of the light from the organic electroluminescent layer 213 can be adjusted by depositing the dielectric layer 207 with different thicknesses. Therefore, the light emitting efficiency and chromaticity of the display 200 can be enhanced by the microcavity effect.

Figure 3:
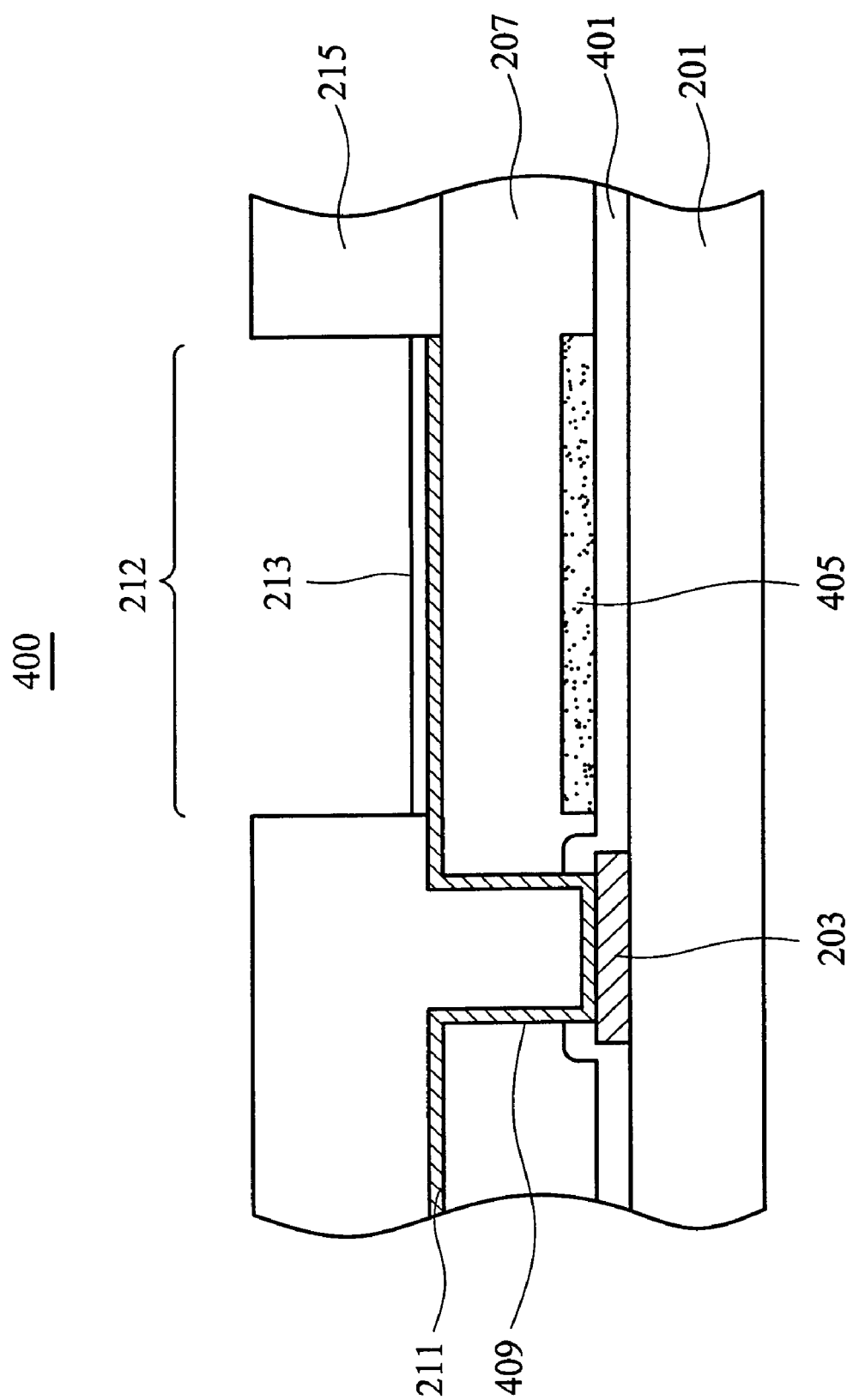
FIG. 3 is a schematic cross section of a top-emitting organic electroluminescent display according to another embodiment of the invention.

FIG. 3 shows a cross section of a top-emitting organic electroluminescent display 400 of another embodiment of the invention, wherein the same symbols in FIG. 2 represents the same components and will not be described in further detail. The difference between the embodiments of FIG. 3 and FIG. 2 is a passivation layer 401 disposed between the conductive layer 203 and the dielectric layer 207 in the embodiment of FIG. 3. Namely, after the conductive layer 203 is formed, the passivation layer 401 is formed in sequence. The passivation layer 401 may be formed from silicon oxide, silicon nitride or combinations thereof. Next, a reflective layer 405 is formed on the passivation layer 401 at the display area 212. Following, the dielectric layer 207 is formed on the conductive layer 203, the passivation layer 401 and the reflective layer 405, and then a via 409 is formed through the dielectric layer 207 and the passivation layer 401 for exposing the conductive layer 203. In this embodiment, the conductive layer 203 and the reflective layer 405 are located at different layers and may be formed from the same or different materials.

Referring to FIG. 3 again, similar to FIG. 2, the transparent electrode layer 211 is formed along the via 409 and on the conductive layer 203 and the dielectric layer 207. The transparent electrode layer 211 as shown in FIG. 3 is different to that of FIG. 1. As shown in FIG. 1, the reflective layer 109 is formed along the via 107 and on the conductive layer 103 and the dielectric layer 105, and then the transparent electrode layer 111 is formed on the reflective layer 109. Therefore, in the embodiment of the invention, the structure in the via 409 can prevent the problem of increasing resistance due to metal oxide formed on the interface between the metal reflective layer and the transparent electrode layer. In addition, compared with the top-emitting organic electroluminescent display of FIG. 1, the reflective layer 405 of the embodiment of the invention is formed at the display area 212 and under the dielectric layer 207, so that the dielectric layer 207 can serve as a microcavity layer to allow light to produce a microcavity effect in the dielectric layer 207. Because the dielectric layer 207 is disposed between the transparent electrode layer 211 and the reflective layer 205 at the display area 212, the route of the down light luminesced from the organic electroluminescent layer 213 can be adjusted by depositing dielectric layer 207 with different thicknesses. Thus, the light emitting efficiency and chromaticity of the display 400 can be enhanced by the microcavity effect.

Figure 4:
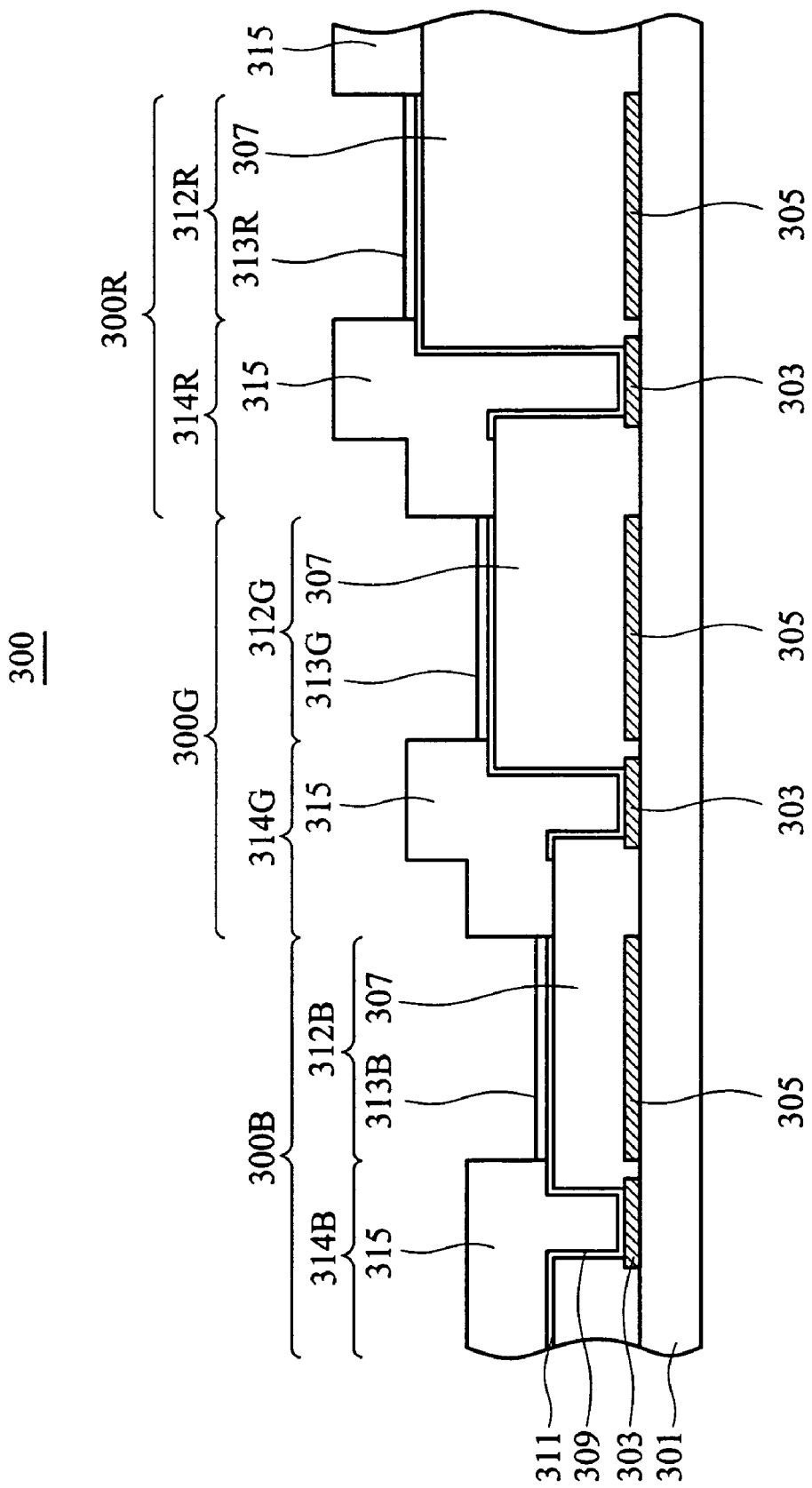
FIG. 4 is a schematic cross section of a top-emitting organic electroluminescent display according to a further embodiment of the invention.

FIG. 4 shows a cross section of a top-emitting organic electroluminescent display 300 of a further embodiment of the invention, wherein the dielectric layer has different thicknesses at each sub-pixel area of a pixel. The light emitting efficiency and chromaticity of the display 300 can be enhanced by adjusting the thickness of the dielectric layer at each sub-pixel area of a pixel. The top-emitting organic electroluminescent display 300 comprises a red sub-pixel area 300R, a green sub-pixel area 300G, and a blue sub-pixel area 300B. The cross section of each sub-pixel area is shown as FIG. 4. For example, the red sub-pixel area 300R comprises a display area 312R and a non-display area 314R. The green sub-pixel area 300G comprises a display area 312G and a non-display area 314G. The blue sub-pixel area 300G comprises a display area 312B and a non-display area 314B. A conductive layer 303 and a reflective layer 305 are formed on an active device substrate 301. The conductive layer 303 is disposed on the non-display areas 314R, 314G, 314B of the active device substrate 301 and electrically connected to the substrate 301. The reflective layer 305 is disposed on the display areas 312R, 312G, 312B of the substrate 301. The conductive layer 303 may be Cu or Al, and used as a contact between a pixel electrode of the organic electroluminescent display and the source/drain of the active device substrate 301. The material of the reflective layer 305 can be Al or Ag, which is used to reflect the down light luminesced form the organic electroluminescent layer at the red sub-pixel area 300R for enhancing the light emitting efficiency of the display. Furthermore, the conductive layer 303 and the reflective layer 305 may be formed from the same or different materials, and both may be formed from the same layer. The reflective layer 305 can be fabricated while the conductive layer 303 is formed. Although the conductive layer 303 and the reflective layer 305 are not connected in FIG. 4, in another embodiment, the conductive layer 303 and the reflective layer 305 can be formed from the same layer and as a continuous structure. The conductive layer 303 and the reflective layer 305 may also be formed from different layers as shown in FIG. 3, wherein the conductive layer 203 and the reflective layer 405 are formed from different layers.

A dielectric layer 307 is formed on the active device substrate 301, the conductive layer 303 and the reflective layer 305. The material of the dielectric layer 307 is such as silicon oxide, silicon nitride or combinations thereof. The dielectric layer 307 has a via 309 exposing the top surface of the conductive layer 303. A transparent electrode layer 311 is formed on the dielectric layer 307, the exposed conductive layer 303 and along the via 309. The transparent electrode layer 311 may be indium tin oxide (ITO), indium zinc oxide (IZO), cadmium tin oxide (CTO), metallized AZO, zinc oxide (ZnO), indium nitride (InN) or stannum dioxide (SnO2). The transparent electrode layer 311 is used as a pixel electrode of the organic electroluminescent display 300, and electrically connected to the source/drain of the active device substrate 301 through the conductive layer 303. An organic electroluminescent layer of red light 313R is formed on the transparent electrode layer 311 over the display area 312R of the red sub-pixel area 300R, corresponding to the reflective layer 305 under the dielectric layer 307. The top-emitting organic electroluminescent display 300 further comprises a pixel definition layer 315 surrounding the organic electroluminescent layer 313R to define the display area 312R of the red sub-pixel area 300R. Besides the above structures, there are an upper electrode, a passivation layer and a transparent upper substrate (not shown) formed on the organic electroluminescent layer in sequence.

As shown in FIG. 4, the display area 312R of the red sub-pixel area 300R, the display area 312G of the green sub-pixel area 300G and the display area 312B of the blue sub-pixel area 300B are defined by the pixel definition layer 315. The organic electroluminescent layer of red light 313R, an organic electroluminescent layer of green light 313G and an organic electroluminescent layer of blue light 313B are formed on the transparent electrode layers 311, corresponding to the display areas 312R, 312G, 312B of the red, green and blue sub-pixel area 300R, 300G and 300B, respectively. The thickness of the dielectric layer 307 at each sub-pixel area can be adjusted according to the chromaticity of the organic electroluminescent layer at each sub-pixel area, so that the luminescent light produces the microcavity effect in the dielectric layer to enhance the light emitting efficiency and the chromaticity of the display. According to the embodiments of the invention, for example, the embodiment as shown in FIG. 4, the dielectric layer 307 at the red sub-pixel area 300R may be adjusted to have the greatest thickness, the dielectric layer 307 at the green sub-pixel area 300G may have the second-great thickness, and the dielectric layer 307 at the blue sub-pixel area 300B may be adjusted to have the smallest thickness.

From the embodiments of the invention we know that shifting the position of the metal reflective layer under the dielectric layer can prevent the problem of increasing resistance due to metal oxide being formed on the interface between the metal reflective layer and the transparent electrode layer. Moreover, the light route can be controlled by adjusting the thickness of the dielectric layer between the reflective layer and the organic electroluminescent layer to make the luminescent light produce the microcavity effect in the dielectric layer, thus the reflective light is enhanced and the chromaticity can be adjusted.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A top-emitting organic electroluminescent display, comprising:

a substrate including a display area;

a conductive layer disposed on the substrate and electrically connected to the substrate;

a reflective layer disposed on the display area of the substrate;

a dielectric layer disposed over the conductive layer, the reflective layer and the substrate, wherein the dielectric layer has a via exposing the conductive layer;

a passivation layer disposed on the substrate and under the reflective layer and the dielectric layer, and the via is formed through the passivation layer and the dielectric layer;

a transparent electrode layer disposed on the dielectric layer and electrically connected to the conductive layer through the via; and an organic electroluminescent layer disposed on the transparent electrode layer over the display area.

2. The top-emitting organic electroluminescent display as claimed in claim 1, wherein the conductive layer is a source/drain contact.

3. The top-emitting organic electroluminescent display as claimed in claim 1, wherein the reflective layer comprises Ag or Al.

4. The top-emitting organic electroluminescent display as claimed in claim 1, wherein the dielectric layer comprises silicon nitride, silicon oxide or combinations thereof.

5. The top-emitting organic electroluminescent display as claimed in claim 1, further comprising a pixel definition layer surrounding the organic electroluminescent layer.

6. The top-emitting organic electroluminescent display as claimed in claim 1, wherein the reflective layer and the conductive layer are formed from the same material.

7. The top-emitting organic electroluminescent display as claimed in claim 1, wherein the reflective layer and the conductive layer are formed from the same layer.

8. The top-emitting organic electroluminescent display as claimed in claim 1, wherein the reflective layer and the conductive layer are formed from different layers.

9. A top-emitting organic electroluminescent display, comprising:

a substrate including a plurality of sub-pixel areas of different colors, wherein the sub-pixel area has a display area and a non-display area;

a conductive layer disposed on the non-display areas of the substrate and electrically connected to the substrate;

a reflective layer disposed on the display areas of the substrate;

a dielectric layer disposed over the conductive layer, the reflective layer and the substrate, wherein the dielectric layer has a via exposing the conductive layer, and the dielectric layer has different thicknesses at the sub-pixel areas of different colors;

a passivation layer disposed on the substrate and under the reflective layer and the dielectric layer, and the via is formed through the passivation layer and the dielectric layer;

a transparent electrode layer disposed on the dielectric layer and electrically connected to the conductive layer through the via; and a plurality of organic electroluminescent layers of different colors disposed on the transparent electrode layer over the display areas.

10. The top-emitting organic electroluminescent display as claimed in claim 9, wherein the sub-pixel areas comprise a red sub-pixel area, a green sub-pixel area and a blue sub-pixel area, and the dielectric layer has a greater thickness at the red sub-pixel area than at the green and the blue sub-pixel areas.

11. The top-emitting organic electroluminescent display as claimed in claim 10, wherein the dielectric layer has a greater thickness at the green sub-pixel area than at the blue sub-pixel area.

12. The top-emitting organic electroluminescent display as claimed in claim 9, wherein the conductive layer is a source/drain contact.

13. The top-emitting organic electroluminescent display as claimed in claim 9, wherein the reflective layer comprises Ag or Al.

14. The top-emitting organic electroluminescent display as claimed in claim 9, further comprising a pixel definition layer surrounding the organic electroluminescent layers of different colors.

15. The top-emitting organic electroluminescent display as claimed in claim 9, wherein the reflective layer and the conductive layer are formed from the same material.

16. The top-emitting organic electroluminescent display as claimed in claim 9, wherein the reflective layer and the conductive layer are formed from the same layer.

17. The top-emitting organic electroluminescent display as claimed in claim 9, wherein the reflective layer and the conductive layer are formed from different layers.

18. The top-emitting organic electroluminescent display as claimed in claim 9, wherein the dielectric layer comprises silicon nitride, silicon oxide or combinations thereof.

* * * * *